United States Patent [19]
Ishikawa

[11] Patent Number: 4,797,710
[45] Date of Patent: Jan. 10, 1989

[54] HEAT DEVELOPING DEVICE

[75] Inventor: Minoru Ishikawa, Kanagawa, Japan

[73] Assignee: Fuji Photo Film Co., Ltd., Kanagawa, Japan

[21] Appl. No.: 129,196

[22] Filed: Dec. 7, 1987

[30] Foreign Application Priority Data

Dec. 5, 1986 [JP] Japan .................................. 61-289058

[51] Int. Cl.⁴ ........................ G03B 27/32; G03B 27/52
[52] U.S. Cl. ...................................... 355/27; 355/100; 355/106; 250/318; 219/216
[58] Field of Search .......................... 355/27, 100, 106; 250/318; 219/216

[56] References Cited

U.S. PATENT DOCUMENTS

| | | | |
|---|---|---|---|
| 3,259,048 | 7/1966 | Smith | 355/27 |
| 3,751,161 | 8/1973 | Berman et al. | 355/27 |
| 3,891,318 | 6/1975 | Touchette | 355/100 |
| 4,076,411 | 2/1978 | Crayton et al. | 219/216 |
| 4,322,158 | 3/1982 | Frias et al. | 355/27 |

Primary Examiner—Monroe H. Hayes
Attorney, Agent, or Firm—Sughrue, Mion, Zinn, Macpeak & Seas

[57] ABSTRACT

The developing section in an image recording apparatus includes a belt having a heater incorporated therein, and the exposed sensitive material and belt are wound together onto a take-up roll for thermally developing the image. After development, rotating the take-up roll in the reverse direction unrolls the sensitive material and allows it to be forwarded on for image transfer.

7 Claims, 2 Drawing Sheets

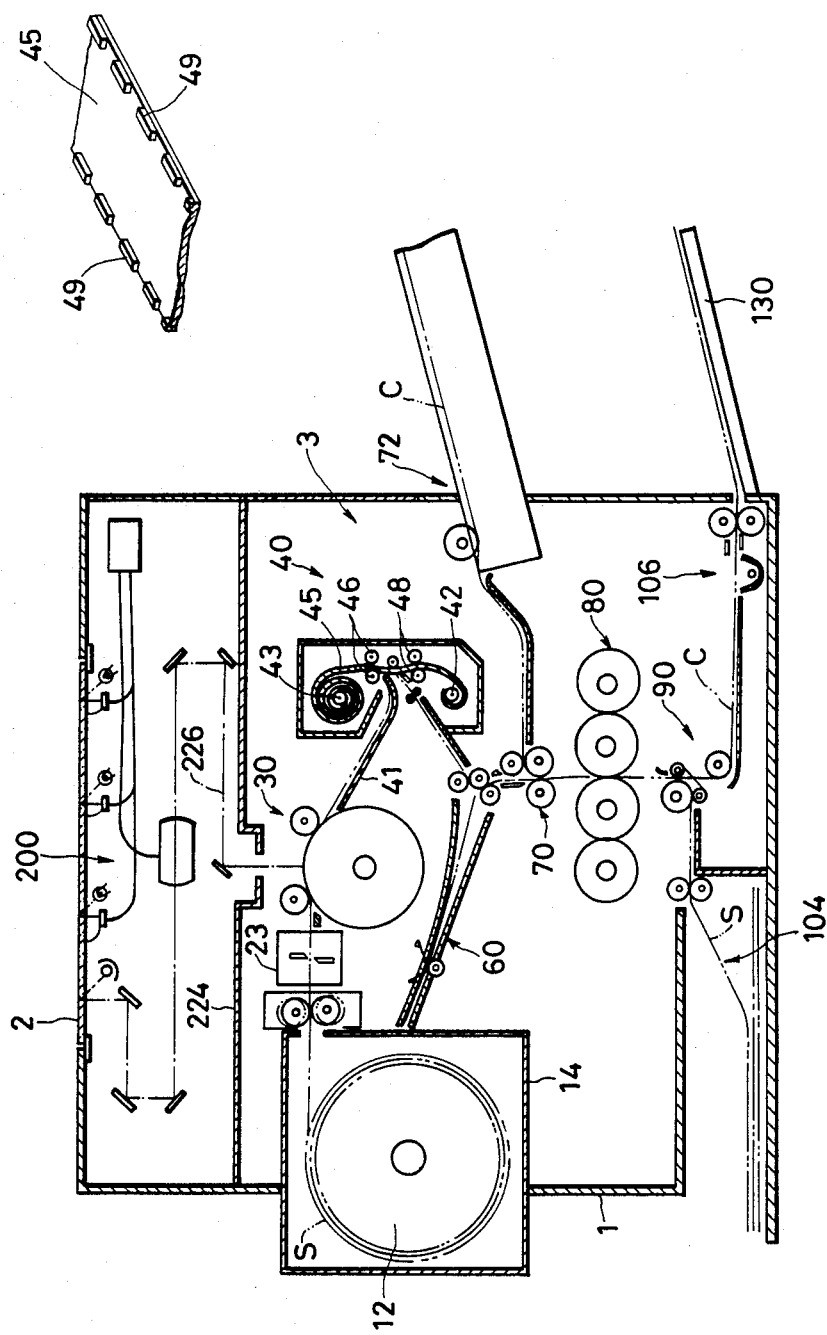

HEAT DEVELOPING DEVICE

BACKGROUND OF THE INVENTION

The present invention relates to a heat developing device for use with an image recorder of the type in which an image is exposed to, and thermally developed on, a thermally developable sensitive material and the developed image on the sensitive material is transferred to an image-receiving material by overlapping both of the materials on each other.

An image recording method using a specific thermally sensitive material is disclosed in the specification of Japanese Patent Application No. 60-121284 filed by the present applicant. The material comprises a carrier or base coated with a thermally sensitive composition consisting of at least a sensitive silver halide, reducing agent, polymeric compound and colored image-forming substance with at least the polymeric compound and colored image-forming substance being sealed in the same microcapsules. According to this image recording method, a latent image is formed on the sensitive material and then thermally developed, and the polymeric compound lying at a portion where the latent image is present is polymerized to generate a high polymer compound thereby hardening the microcapsules. Then the sensitive material is overlapped with an image-receiving material having a layer capable of allowing the colored image-forming substance to be transferred to the sensitive material, and pressure is applied on the overlapped materials so that the microcapsules at a portion where the latent image is absent are partly broken to cause the colored image-forming substance to be transferred to the image-receiving material to form an image thereon.

A heat developing device for use with an image recorder employed in the above image recording method is shown in FIG. 3. As shown, the heat developing device 401 heats a sensitive material S rolled around a cylindrical heating drum 402. In order to thermally develop the entire surface of the sensitive material S simultaneously, it is necessary for the heating drum 402 to have a circumference larger than the length of the sensitive material S.

Accordingly, where the length of one sheet of the sensitive material S in its feeding direction is large and the area occupied by an image is large, the requirement that the heating drum 402 have a diameter large enough to match the length of the sensitive material S means that the image recorder will inevitably be very large.

In order to solve the above-described problems, it is an object of the present invention to provide a heat developing device of the structure which enables its image recorder to be small in size.

SUMMARY OF THE INVENTION

The heat developing device for an image recorder according to the present invention is of the type in which an image-exposed sensitive material is thermally developed and then the developed image is transferred to an image-receiving material by overlapping the sensitive material and image-receiving material on each other. The heat developing device comprises a delivery roll rotatable in both clockwise and counter-clockwise directions, a take-up roll rotatable in both clockwise and counter-clockwise directions in synchronism with the delivery roll, and a belt having a heater incorporated therein and having one end connected to the delivery roll and another end connected to the take-up roll, the operation of the device being such that the take-up roll rolls up the heater-incorporated belt together with the sensitive material.

Since the sensitive material is rolled up simultaneously with the heater-incorporated belt, the size of the heat developing device can be reduced, which results in reducing the size of the image recorder in which the device is used. Further, the smaller the size of the developng section, the shorter the time required for warming it up, which leads to an increase in the economy of operation.

BRIEF DESCRIPTION OF THE DRAWINGS

One embodiment of the present invention will now be described in detail with reference to the accompanying drawings, in which:

FIG. 1 is a sectional view of an image recorder employing a heat developing device according to the present invention;

FIG. 2 is a perspective view of a part of a heater-incorporated belt; and

DETAILED DESCRIPTION OF THE INVENTION

Figure 3:
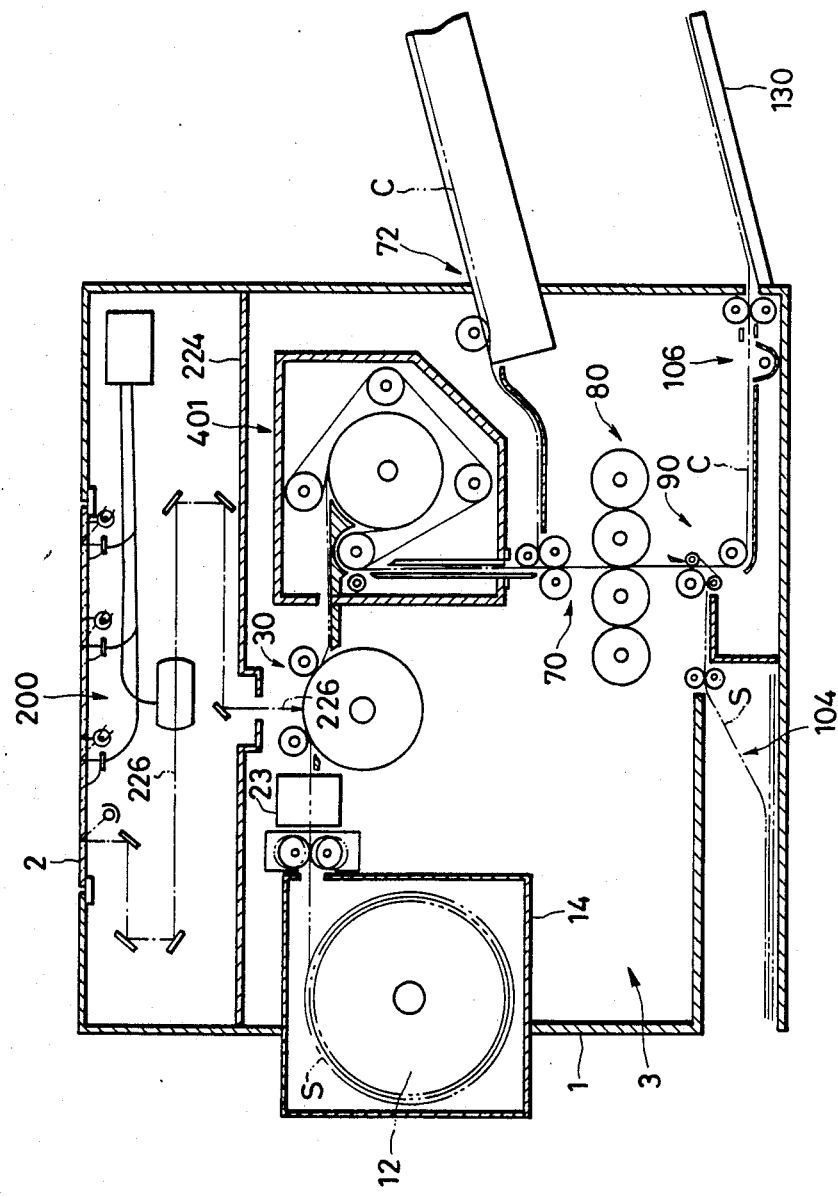
FIG. 3 is a sectional view of an image recorder using a heating drum.

FIG. 1 shows an image recorder in which a heat developing device according to the present invention is employed. As shown in FIG. 1, a glass plate 2 for supporting an original is attached to the upper surface of a housing 1, and below the glass plate 2 there is arranged a well known image-forming lens transfer type optical system 200. The image-forming optical system 200 and a lower unit section 3 are separated by a partition wall 224.

Further, a cartridge 14 which houses therein a roll 12 of sensitive material S is removably attached to one side of the housing 1. The sensitive material delivered from the cartridge 14 is cut to a predetermined length by a cutter unit 23 and image-wise exposed by being subjected to imaging rays of light 226 at an exposure section 30.

The sensitive material S which has been image-wise exposed at the exposure section 30 is then thermally developed by the heat developing device 40 formed of a heater-incorporated belt 45 having its one end fixed to a delivery roll 42 and other end fixed to a take-up roll 43, the device 40 also including nipping rollers 46 and a scraper 48.

After development, the facing direction of the sensitive material will be reversed in the manner described in more detail below, so that the material can then be overlapped with an image receiving paper C supplied from an image receiving paper supply device 72, and a pressure of about 500 kg/cm$^2$ is applied to the overlapped paper and material by a pressure transfer means 80 so that an image on the sensitive material S is transferred to the image-receiving paper C.

After the above pressure transfer of the image, the sensitive material S and the image-receiving paper C are separated from each other, with the former being discarded into a sensitive material disposing section 104 while the latter is fixed by a fixing unit 106 and delivered to a take-up tray 130.

The operation of the heat developing device will now be described. The sensitive material S which has been image-wise exposed at the exposure section 30 is guided along a guide 41 to the nipping rollers 46 where it joins heater-incorporated belt 45, and simultaneously the delivery roll 42 and the take-up roll 43 operate to cause the sensitive material S to be nipped between the nipping rollers 46 together with the heater-incorporated belt 45 so that the sensitive material S is wound around the take-up roll 43. The sensitive material S is then thermally developed while it is held on the take-up roll 43.

Upon completion of the thermal development, the take-up roll 43 and the delivery roll 42 are rotated in a reverse direction so that the heater-incorporated belt 45 is rolled up by the delivery roll 42. During this operation, the sensitive material S is separated from the heater-incorporated belt 45 by means of the scraper 48 and delivered to a switch-back means 60.

Further, as shown in FIG. 2, rows of projections 49 are provided at the edges of the heater-incorporated belt 45 with the projections of each row being spaced apart from another, and it is therefore possible to blow hot air between the belt 45 and the sensitive material S, from the transverse direction, thereby contributing to both the speed and equalization of heating.

It should be noted that, although the invention has been described herein in the context of a heat developing device for use with an image recorder wherein the sensitive material and image receiving material are overlapped on each other and an image is pressure-transferred between them, the present invention is not to be limited thereto but is applicable as well to an image recorder of the type that performs both development and transfer by heating simultaneously, or separately without the application of pressure.

The heat developing device according to the present invention is constructed such that the sensitive material is heated as it is rolled up with the heater-incorporated belt so that it can be heated in the form of a roll of small diameter. Accordingly, the size of the device is reduced so that the image recorder provided with such device can be miniaturized.

I claim:

1. A heat developing device for use with an image recorder of the type in which an image is exposed onto a thermally developable sensitive medium and is therefter developed, and the developed image is transferred to an image-receiving material by overlapping the sensitive material and the image-receiving material on each other, said device comprising:
   a belt having heating means incorporated therein;
   means for delivering said sensitive material into contact with said belt; and
   a take-up roll rotatable in a first direction to roll up said belt and sensitive material for development of said sensitive material and rotatable in a second direction to unroll said belt and sensitive material from said take-up roll.

2. A heat developing device according to claim 1, wherein said take-up roll secures one end of said belt and said device further comprises a delivery roll securing the other end of said belt and rotatable in synchronism with said take-up roll.

3. A heat developing device according to claim 1, further comprising separating means for maintaining a gap between at least a portion of said sensitive material and said belt while said sensitive material and belt are wound onto said take-up roll.

4. A heat developing device according to claim 3, wherein said separating means comprises a plurality of projections on one of said sensitive material and belt, said projections being spaced apart from one another in the longitudinal direction of said belt when said sensitive material and belt are in contact with one another.

5. A heat developing device according to claim 4, wherein said plurality of projections are provided on said belt.

6. A heat developing device according to claim 5, wherein said plurality of projections comprises a row of projections along opposite edges of a side of said belt facing said sensitive material.

7. An image recorder of the type in which an image is exposed onto a thermally developed sensitive medium and is thereafter developed, and the developed image is transferred to an image-receiving material by overlapping the sensitive material and the image-receiving material on each other at an image transfer station, said image recorder comprising:
   a belt having heating means incorporated therein and having first and second ends;
   guide means for delivering said sensitive material into contact with said belt;
   a take-up roll rotatable in a first direction to roll up said belt and sensitive material for development of said sensitive material and rotatable in a second direction to unroll said belt and sensitive material from said take-up roll; and
   image transfer means for receiving the sensitive material unrolled from said take-up roll for transfer of the developed image onto an image receiving medium.

* * * * *